(12) United States Patent
Clara et al.

(10) Patent No.: US 7,049,877 B2
(45) Date of Patent: May 23, 2006

(54) SWITCHED LEVEL-SHIFT CIRCUIT

(75) Inventors: Martin Clara, Villach (AT); Andreas Wiesbauer, Pörtschach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/017,425

(22) Filed: Dec. 20, 2004

(65) Prior Publication Data
US 2005/0127976 A1   Jun. 16, 2005

Related U.S. Application Data

(63) Continuation of application No. PCT/EP03/06949, filed on Jun. 30, 2003.

(30) Foreign Application Priority Data
Jul. 19, 2002   (EP)   .................................. 02016119

(51) Int. Cl.
*G06F 7/64* (2006.01)

(52) U.S. Cl. ...................................... 327/333; 327/390

(58) Field of Classification Search ................ 327/390, 327/333; 326/68, 69, 70, 71, 72, 73, 74, 326/80, 81

See application file for complete search history.

(56) References Cited

U.S. PATENT DOCUMENTS

| 4,896,061 | A  |   | 1/1990 | Ahmed ........................ 307/575 |
|-----------|----|---|--------|----------------------------------------|
| 6,509,781 | B1 | * | 1/2003 | Dufort ......................... 327/434 |
| 6,677,798 | B1 | * | 1/2004 | Chang et al. ................ 327/333 |
| 6,844,769 | B1 | * | 1/2005 | Yamamoto et al. .......... 327/333 |
| 2004/0119522 | A1 | * | 6/2004 | Tachibana et al. ........... 327/390 |

FOREIGN PATENT DOCUMENTS

| DE |   158837   | 2/1983 |
| DE | 0597200 A1 | 8/1993 |
| JP |  01175317  | 7/1989 |
| JP |  02086213  | 3/1990 |

OTHER PUBLICATIONS

International Search Report dated Jan. 2, 2004.
European Search Report dated Jan. 3, 2003.

* cited by examiner

*Primary Examiner*—Kenneth B. Wells
*Assistant Examiner*—Khareem E. Almo
(74) *Attorney, Agent, or Firm*—Jenkins, Wilson, Taylor & Hunt, P.A.

(57) ABSTRACT

Switched level-shift circuit (SLSC) for a signal-switch (1) which is provided for switching an applied analog input signal ($V_{AIN}$), wherein the switched level-shift circuit (5) comprises an input terminal (13) for the analog input signal applied to the signal-switch (1), a control input terminal (18) for a control signal (SW), an analog level-shift circuit (15) which adds a constant voltage to the analog input signal ($V_{AIN}$) to generate a level-shifted analog output signal when the control signal (SW) is in a first logical state (high); and an output terminal (4) for the generated level-shifted analog output signal which is connected to a gate terminal (2) of said signal-switch (1).

10 Claims, 7 Drawing Sheets

OFF    ON

SWITCHED LEVEL-SHIFT CIRCUIT

RELATED APPLICATIONS

This application is a continuation of PCT patent application number PCT/EP03/06949, filed Jun. 30, 2003, which claims priority to European patent application number 02016119.6, filed Jul. 19, 2002, the disclosures of each of which are incorporated herein by reference in their entirety.

TECHNICAL FIELD

The invention refers to a switched level-shift circuit (SLSC).

BACKGROUND ART

Figure 1:
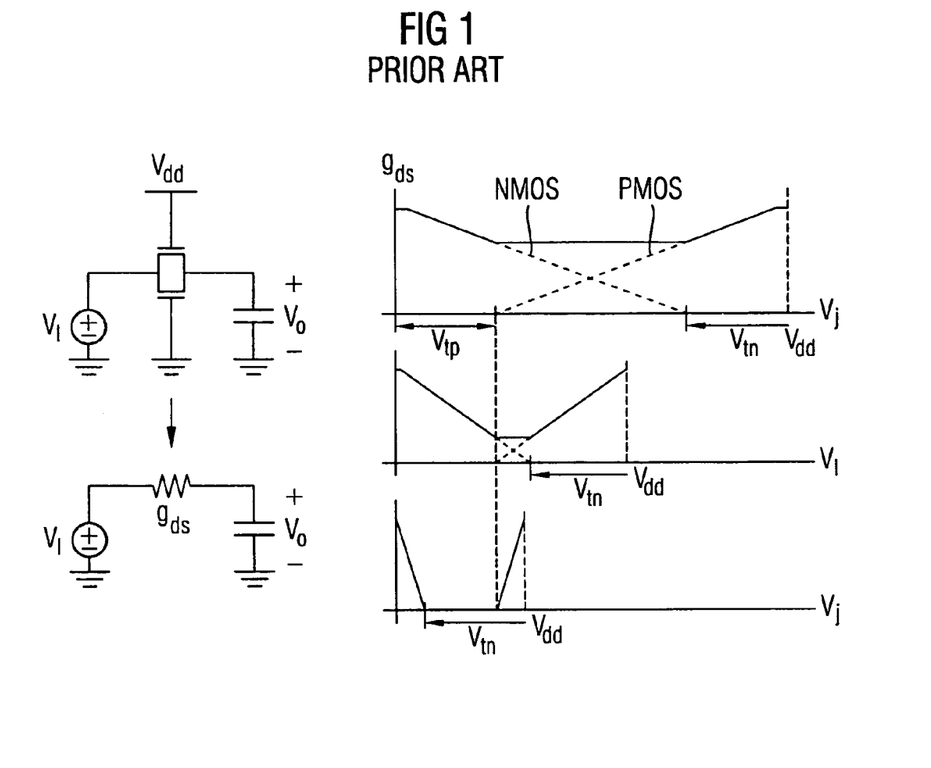
FIG. 1 shows a transmission gate to explain the problem underlying the present invention.

Signal switches and in particular MOS-switches are used in many circuits, such as track and holds, programmable gain amplifiers (PGA), tunable filters or switched capacitor applications. When designing switched capacitor circuits on a low voltage supply there is a difficulty of implementing the signal or MOS-switches. Typically, in a switched capacitor circuit, an analog input signal $V_i$ is sampled through a MOS-switch or transmission gate as shown in FIG. 1. Ideally, the switch in the on-stateacts as a fixed linear conductance $g_{ds}$. In practice the conductance of the switch varies with the signal voltage as shown in FIG. 1. Plotted in FIG. 1 is the switch conductance versus the input signal $V_i$ for three different supply voltages $V_{dd}$. The dashed line shows the individual conductances of the NMOS and PMOS devices and the solid line shows the effective parallel conductance.

In the first case $V_{dd}$ is much larger than the sum of two threshold voltages $V_{tn}$ and $V_{tp}$. In this case, it is easy to achieve a large on conductance from rail to rail for the input signal $V_i$.

In the second case the supply voltage $V_{dd}$ is comparable to the sum of the threshold voltages and there is a substantial drop in conductance when the input signal $V_i$ approaches $V_{dd}/2$.

In the third case, where the supply voltage $V_{dd}$ is less than the sum of the two threshold voltages, there is a large range of the input signal VI for which the switch will not conduct.

To overcome this problem it was suggested by Fujimoro, L. Longo, A. Hirapethian, et al. "In 90-DBSNR 2.5 MHz output rate ADC using cascaded multi-bit delta sigma modulation at 8× oversampling rate", JSSC, vol. 35, December 2000 to use low threshold voltages devices for switches in the signal path. To achieve this additional masks for processing those switches are necessary and the manufacturing process becomes much more complex.

Therefore it was proposed to use a charge pump and to increase the supply voltage for the switch drivers locally. This was suggested by A. R. Feldmann "A 13 bit, 1.4 Ms/s sigma delta modulator for RF baseband channel application", JSSC, vol. 83, October 1998. In this approach the gate overdrive is signal dependent leading to non linearities and harmonic distortion of the applied analog signal.

Conventional implementations result in voltage stress that exceeds the supply by a large margin.

Another approach to overcome the above mentioned problem is to keep the gate overdrive of the MOS-switch constant by employing a technique called boot-strapping. In A. M. Abo, P. R. Gray "A 1.5-V, 10-bit, 14.3-MS/s CMOS Pipe-line Analog-to-Digital Converter", IEEE journal of solid-state circuits vol. 34, no. 5, may 1999, a boot-strap circuit and switching device is described.

Figure 2:
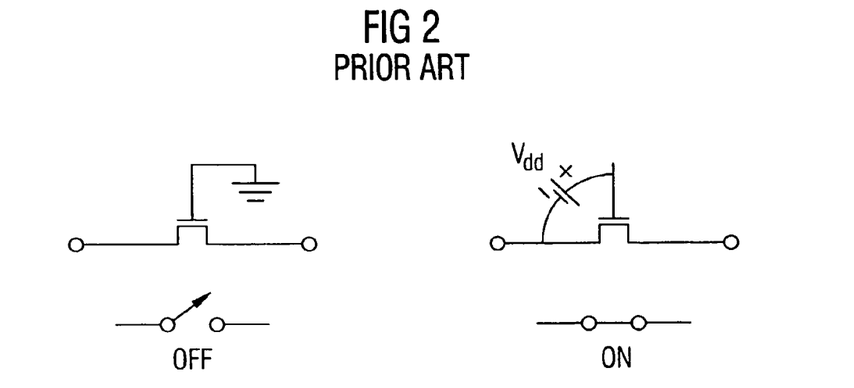
FIG. 2 shows a bootstrap MOS-switch according to the state of the art.

FIG. 2 shows a bootstrap MOS-switch according to the state of the art. Transmission gates are used extensively in switch-capacitor gate stages of a pipeline. Since the threshold voltages of the NMOS and PMOS transistors are 0.7V and 0.9V, respectively, conventional transmission gates with any usable signal swing are not directly realizable. Therefore a bootstrap switch as shown in FIG. 2 was suggested. Consequently a boot-stapped switch was designed to observe device reliability considerations. The switch shown in FIG. 2 according to the state of the art is conceptually a single NMOS transistor. In the "off"-state the gate is grounded and the device is cut off. In the "on"-state a constant voltage of $V_{dd}$ is supplied across the gate-to-source terminals, and a low on-resistance is established from drain to source independent of the input signal. Although the absolute voltage applied to the gate may exceed the supply voltage $V_{dd}$ for a positive input signal, none of the terminal-to-terminal device voltages exceeds $V_{dd}$.

Figure 3:
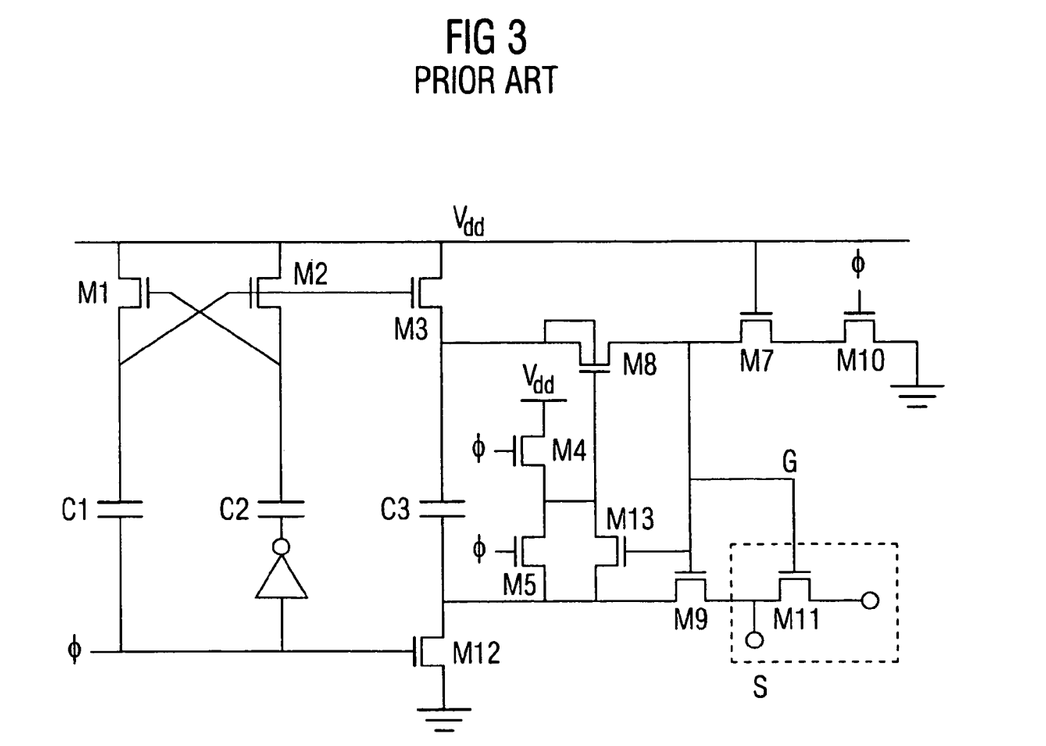
FIG. 3 shows a bootstrap circuit and switching device according to the state of the art.

FIG. 3 shows a bootstrap circuit according to prior art. The bootstrap circuit shown in FIG. 3 operates on a single phase clock φ that turns the switch M11 on and off. During the off phase φ is low. Devices M7 and M10 discharge the gate of M11 to ground. At the same time, the supply voltage $V_{dd}$ is supplied across capacitor C3 by MOS-FET M3 and MOS-FET M12. The capacitor C3 acts as a battery across the gate and source during the "on" phase. MOS-FET M8 and MOS-FET M9 isolate the switch from capacitor C3 while it is charged. When the phase clock φ goes high, the MOS-FET M5 pulls down the gate of MOS-FET M8, allowing charge from the battery capacitor C3 to flow onto gate G of the switch M11. The MOS-FET M9 enables the gate G to track the input voltage S shifted by $V_{dd}$, keeping the gates source voltage $V_{gs}$ constant regardless of the input signal. For instance, when the source S is at $V_{dd}$, then the gate G is at $2 \times V_{dd}$, however, the gate source voltage $V_{gs}$ is as high as the supply voltage $V_{dd}$. Because the body (N-well) of MOS-FET M8 is tied to is source, latch up is suppressed. The capacitor C3 must be efficiently large to supply charge to the gate G of the switching device in addition to all parasitic capacitance in the charging path.

The disadvantage of the bootstrap circuit and switching device according to the state of the art as shown in FIG. 3 resides in that a clock signal φ is necessary to recharge the battery capacitor C3. The boot-strap circuit of FIG. 3 needs a clock signal and cannot be used for continues time switches for instance in PGAs or tunable filters.

SUMMARY OF THE INVENTION

Accordingly is the object of the present invention to provide a switched level shift circuit for boot-strapping of a MOS-switch which does not require a periodic clock signal in order to work properly.

This object is achieved by a switched level-shift circuit (SLSC) having the features of main claim 1.

The invention provides a switch level-shift circuit (SLSC) for a signal-switch, which is provided for switching an applied analog input signal, wherein the switched level-shift circuit (SLSC) comprises:

an input terminal for the analog input signal applied to that MOS-switch, a control input terminal for a control signal, an analog level-shift circuit which adds a constant voltage to the analog input signal to generate a level-shifted analog output signal when the control signal is in a first logical state (high), and an output terminal for the generated level-shifted analog output signal which is connected to a gate terminal of said signal-switch.

The switched level-shift circuit (SLSC) has the advantage of being also feasible for continues time switches.

In a preferred embodiment of the switch level-shift circuit according to the present invention the analog level-shift circuit comprises a first current source which is switched on when the control signal is in the first state (high), at least one resistor connected in series with the current source, wherein the resistor generates a constant voltage drop when the first current source is switched on, a MOS-FET connected in series with the resistor, wherein the MOS-FET has a gate connected to the signal input terminal, a source and a drain connected to said resistor, wherein the generated constant voltage drop of the resistor and the gate-source voltage of the MOS-FET form the constant voltage added to the analog input signal to generate the level shifted analog output signal.

In an embodiment of the switched level-shift circuit (SLSC) according to the present invention, the source of the MOS-FET within the analog level shift circuit is connected to the ground.

In an alternative embodiment of the switched level-shift circuit (SLSC) according to the present invention the source of the MOS-FET within the analog level shift circuit is connected to a second current source.

In a preferred embodiment of the switched level-shift circuit (SLSC) according to the present invention both current sources are formed by a MOS-FET each having a gate which is connected to an enable switch which switches a bias voltage ($V_{bias}$) to the gate of the MOS-FET when the control signal is in the first logical state (high).

In a preferred embodiment the switched level-shift circuit (SLSC) according to the present invention the output terminal of the SLSC is connected to a disable switch which switches the gate of the MOS-switch to ground when the control signal is in a second logical state (low).

In a further embodiment of the switched level-shift circuit (SLSC) according to the present invention the analog level-shift circuit comprises an operational amplifier the supply voltage of which is switched to enable the operation amplifier when the control signal is in the first logical state (high) wherein the operational amplifier has a first non inverting input connected to the input terminal of the switched level-shift circuit (SLSC), an output connected to a first switchable current source, and a second inverting input, wherein the analog level-shift circuit further comprises a resistor connected in series with the first current source wherein the resistor generates a constant voltage drop when the first switchable current source is switched on by the enabled operation amplifier and a second switchable current source connected in series with the resistor which is switched on when the control signal is in the first logical state (high).

In a preferred embodiment of the switched level-shift circuit (SLSC) according to the present invention the switched level-shift circuit is connected to a replica bias loop for calibrating the constant voltage.

In a preferred embodiment of the switched level-shift circuit (SLSC) according to the present in invention the switched level-shift circuit operates the MOS-switch with a constant gate overdrive when the control signal is in a first logical state (high).

In a still further embodiment of the switched level-shift circuit (SLSC) the switched level-shift circuit is a differential switched level-shift circuit for a differential analog input signal.

In the following preferred embodiments of the switched level-shift circuit (SLSC) according to the present invention are described with a reference to the enclosed figures.

DETAILED DESCRIPTION OF THE INVENTION

Figure 4:
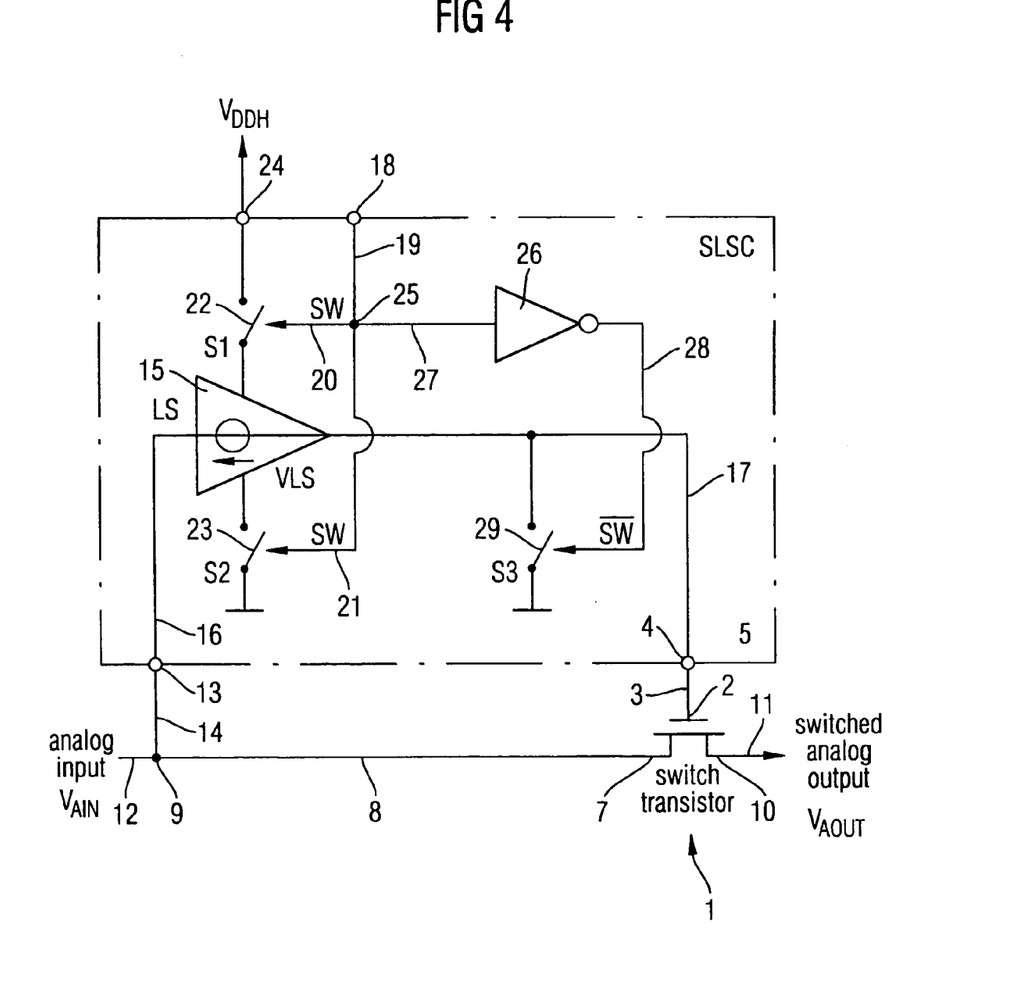
FIG. 4 shows a block diagram of a switched level-shift circuit (SLSC) according to the present invention.

As can be seen from FIG. 4 a switch transistor 1 has a gate 2 connected via a line 3 to an output terminal 4 of a switched level-shift circuit 5 according to the present invention. The switched level-shift circuit 5 operates the MOS-switch 1 with a constant gate overdrive when a control signal SW is in a first logical state (high). The MOS-switch 1 has a drain and a source terminal. The source terminal 7 is connected via line 8 to a branch node 9. The drain terminal 10 of the MOS-switch 1 is connected to an output signal line 11. The branch node 9 receives via a signal line 12 an analog input signal VAIN from a signal source. The applied analog input signal is supplied to an input terminal 13 of the switched level-shift circuit 5 via a line 14. The applied analog input voltage $V_{AIN}$ is supplied to a analog level-shift circuit 15 within the switched level-shift circuit 5 via a line 16. The output of the analog level-shift circuit 15 is connected via a line 17 to the output terminal 4 of the switch level-shift circuit 5. The analog level-shift circuit 15 adds a constant voltage to the analog input signal applied to terminal 13 to generate a level shifted analog output signal when the control signal SW is in a first logical state (high). The control signal SW is applied to the switched level-shift circuit 5 by means of a control input terminal 18. The applied control signal is branched off via internal control signal lines 19 to 21 to turn on/off switches 22, 23 which switch on/off a supply voltage $V_{ddh}$ for the analog level-shift circuit 15. The supply voltage $V_{ddh}$ is applied to the switched level-shift circuit 5 by means of a supply voltage terminal 24.

The control input signal applied to terminal 18 is branched off at node 25 and applied to an internal inverter 26 via an internal control line 27. The output of the inverter 26 is connected via a line 28 to a third switch 29 which is connected to the output signal line 17.

When the control signal is in a first logical state (high) the enable switches 22, 23 are switched through and the analog level-shift circuit 15 is enabled so that a constant voltage is added to the analog input signal $V_{AIN}$, and the sum of the analog input voltage $V_{AIN}$ and the constant voltage $V_{LS}$ is applied to the gate 2 of the switch transistor 1. The switch transistor 1 is therefore operated with a constant gate overdrive, equal to the constant voltage $V_{LS}$. When the control signal SW is in the first logical state (high) the third switch 29 is switched off so that the output terminal 4 of the switched level-shift circuit 5 is not grounded.

When the control signal is in a second logical state (low) the gate 2 of the switch transistor 1 is tied to ground by means of switch 29, effectively switching off the switch transistor 1. At the same time the switches 22, 23 are open and the switched level-shift circuit 5 does not consume power.

For continues operation the control signal is always in a first logical state (high). In the continues operation the switch transistor 1 is always on with a constant gate overdrive of $V_{LS}$.

For a large signal swing of the analog input voltage the required gate overdrive of switch transistor 1 eventually exceeds the supply voltage. In this case the switch level shift circuit 5 according to the present invention is operated with a supply voltage $V_{ddh} > (V_{AIN}+V_{LS})_{max}+V_{DSAT}$. An additional saturation voltage is provided for the current source transistor driving the output of the switched level-shift circuit 5. Accordingly in a preferred embodiment of the switched level-shift circuit 5 according to the present invention the analog level-shift circuit 15 is built with dual-GOX-transistors withstanding the high supply voltage $V_{ddh}$. The switch transistor 1 can be a regular transistor provided that $V_{LS} \leq V_{dd}$. For example in a 0,13 μm CMOS technology with a supply voltage $V_{dd}$=1.2V the switched level-shift circuit 5 can be operated with a high supply voltage $V_{ddh}$=2.5V. For $V_{LS}$=1.2V the maximum signal swing $V_{AINmax}$ can be as high as 1V. In a continues time operation the control signal SW is always in a first logical stage (high) thus the switched level-shift circuit 15 is always enabled. The control signal SW can be used for a power down functionality.

The switched level-shift circuit (SLSC) as shown in FIG. 4 provides bootstrapping of the switch transistor 1 with a constant gate overdrive. The switched level-shift circuit 5 (SLSC) according to the present invention can also be used in switched sampling circuits with a reduced power consumption. Further a continues time operation of the switched level-shift circuit 5 is possible for static programming switches without any modification. As can be seen from FIG. 4 the switched level-shift circuit 5 according to the present invention for bootstrapping of the switch transistor 1 is operable without a clock signal.

In the following preferred embodiments of the switched level-shift circuit 5 according to the present invention are described in detail.

Figure 5:
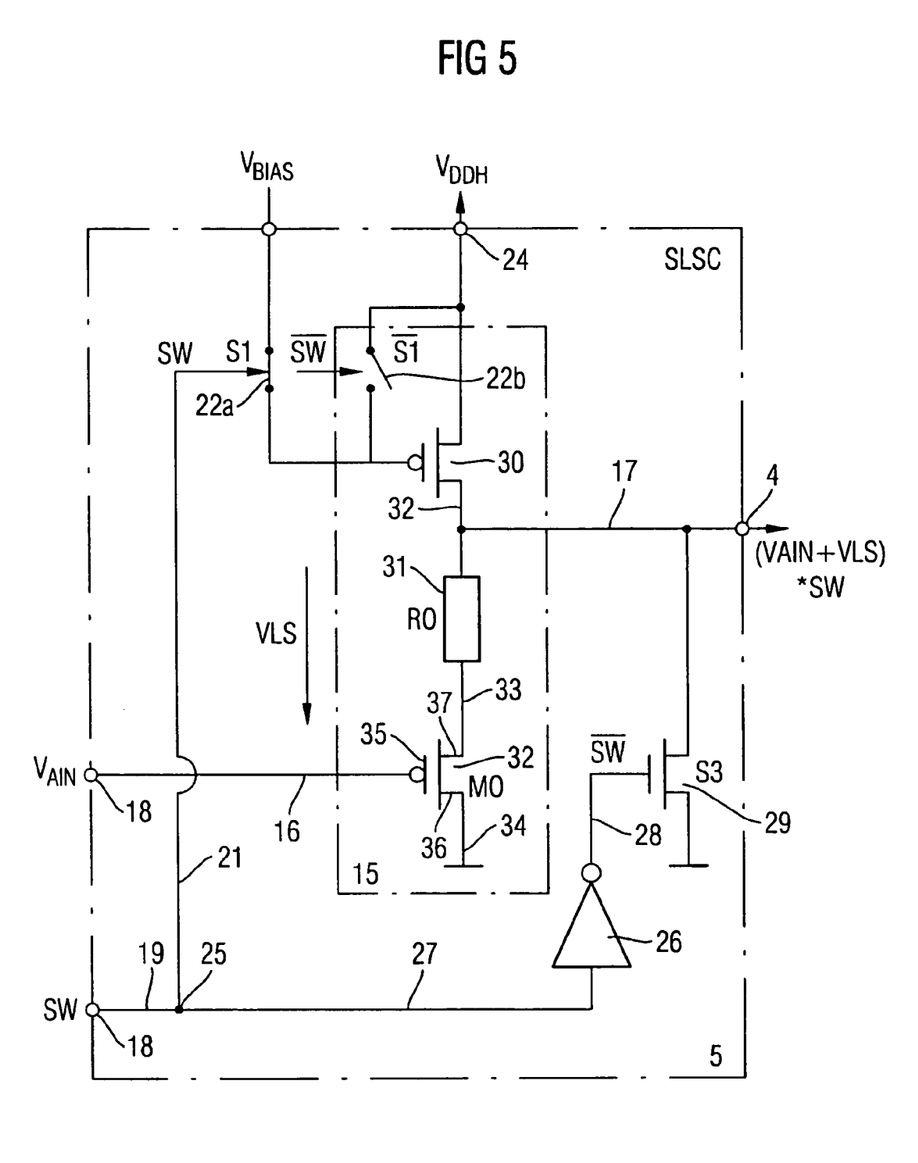
FIG. 5 shows a first embodiment of the switched level-shift circuit (SLSC) according to the present invention.

FIG. 5 shows a first embodiment of the switched level-shift circuit 5 according to the present invention.

The analog level-shift circuit 5 of the switched level-shift circuit 5 comprises in the shown embodiment a first current source 30 which is switched on by enabling switch 22a when the applied control signal SW is in the first logical state (high). The first current source 30 is formed by a PMOS-transistor in the shown embodiment. The enabling switch 22a switches the gate of the PMOS 30 to a biasing voltage $V_{bias}$. Switch 22b is provided to discharge the gate of PMOS 30 when the control signal SW is logical low. The analog switched level-shift circuit 15 further comprises at least one resistor 31 connected via a line 32 in series with the current source 30. The resistor 31 generates a constant voltage drop when the first current source 30 is switched on.

The analog switched level-shift circuit 15 further comprises a MOS-FET 32 connected in series to the resistor 31 via a line 33. The MOS-FET 32 is grounded via a line 34 in the embodiment shown in FIG. 5. The MOS-FET 32 has a gate 35 which is connected to the signal input terminal 3 via the signal line 16. The source 36 of MOS-FET 32 is connected via line 34 to a reference potential, e.g. ground. The drain 37 of MOS-FET 32 is connected to the resistor 31. The generated constant voltage drop of the resistor 31 and the gate source voltage of the MOS-FET 32 between the gate terminal 35 and the source terminal 37 of the MOS-FET 32 form a constant voltage $V_{gs}$ which is added to the analog input signal VAIN to generate a level-shifted analog output signal which is supplied to the output terminal 4 of the switched level-shift circuit 5.

Figure 6:
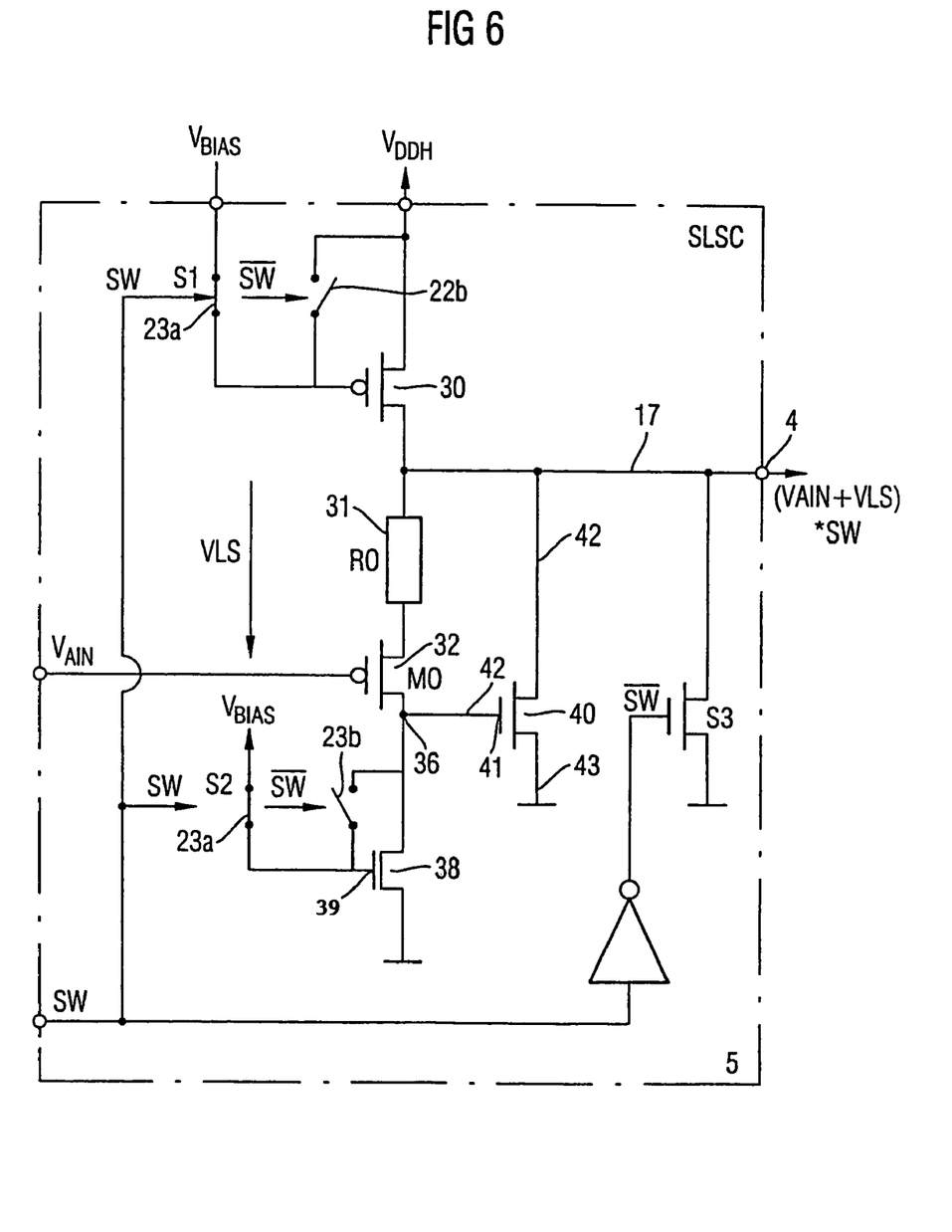
FIG. 6 shows a second embodiment of the switched level-shift circuit (SLSC) according to the present invention.

FIG. 6 shows a further embodiment of the switched level-shift circuit 5 according to the present invention. In the embodiment shown in FIG. 6 a further current source 38 formed by a MOS-FET 38 is provided. The second current source 38 is connected to the drain terminal 36 of MOS-FET 32. The second current source 38 has a gate 39 connected to an enabling switch 23a which is controlled by the control signal SW. Enabling switch 23a is closed when the control signal SW is in a first logical stage (high). A switch 23b is provided to discharge the gate 39 of NMOS 38 to cut off NMOS 38 when the control signal is in a second logical state (low). The switched level-shift circuit 5 includes further a MOS-FET 40 having a gate 41 connected via line 42 to the drain terminal 36 of MOS-FET 32. The MOS-FET 40 is an NMOS connected to the output signal line 17 via line 42. The MOS-FET 40 is further grounded via line 43. The MOS-FET 40 acts as a source follower and is provided to lower the output impedance of the switched level-shift circuit 5.

Figure 7:
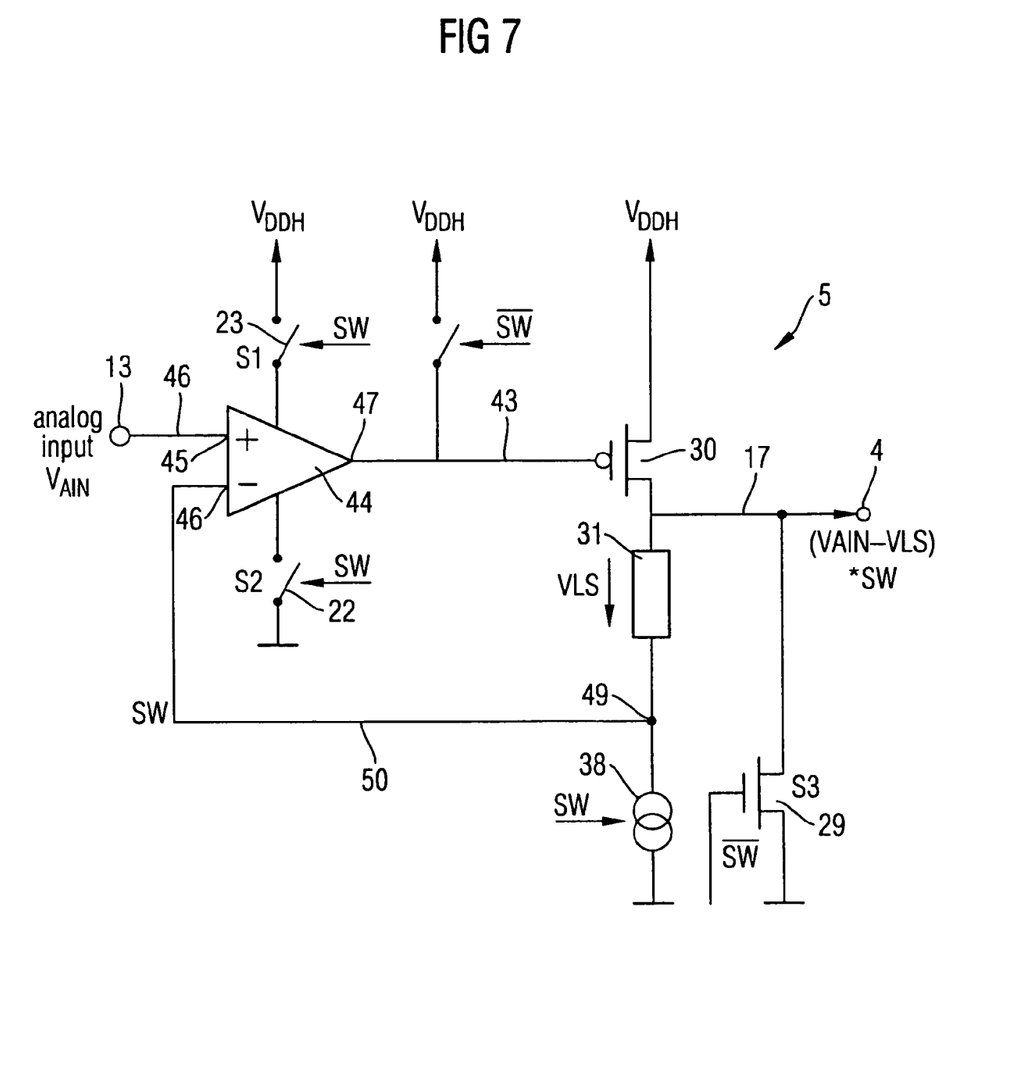
FIG. 7 shows a third embodiment of the switched level-shift circuit (SLSC) according to the present invention.

FIG. 7 shows the third embodiment of the switched level-shift circuit 5 according to the present invention. The analog level-shift circuit 15 comprises in the shown embodiment an operational amplifier 44 the supply voltage of which is switched on to enable the operation amplifier 44, when the control signal SW is in a first logical state (high). To this end the operation amplifier 44 is switched on by the enabling switches 22, 23. The operational amplifier 44 has a first non inverting input 45 connected to the input terminal 13 via signal line 46. The operation amplifier 44 further has second inverting input terminal 46 and an output 47 connected to a first switchable current source 30. The resistor 31 is connected in series with the first current source 30 and generates a constant voltage drop when the first switchable current source 30 switched on by the enabled operation amplifier 44 via line 48. The other terminal of the resistor 31 is connected to a second switchable current source 38 which is grounded. At a node 49 the inverting terminal 46 of the operation amplifier 44 is connected via a line 50 to the resistor 31.

Figure 8:
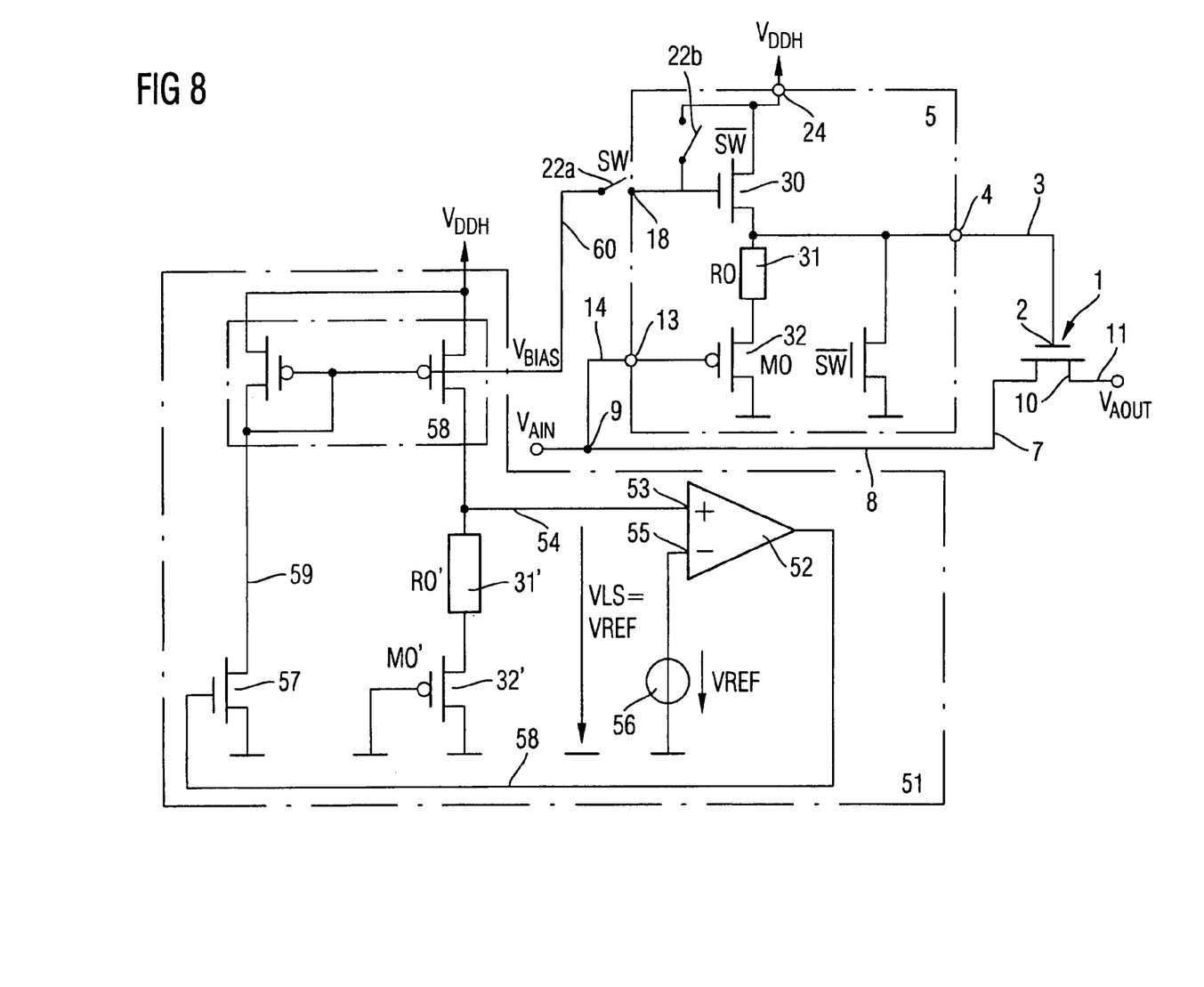
FIG. 8 shows a replica bias loop for calibrating the constant voltage of the switched level-shift circuit (SLSC) according to the present invention.

FIG. 8 shows a replica bias loop 51 for calibration of the constant voltage generated by the switched level-shift circuit 5 according to the present invention. The replica bias loop as shown in FIG. 8 may be used for all embodiments of the switched level-shift circuit 5 as shown in FIG. 4 to 6. The replica bias loop includes replica 31' of resistor 31 and a replica 32' of MOS-FET 32 within the switched level-shift circuit 5. The replica bias loop 51 further includes an operation amplifier 52 having a first input terminal 53 connected via line 54 to the replica circuit and a second terminal 55 connected to a reference voltage source 56. The replica bias loop 51 further includes an NMOS 57 gate which is connected via a feedback line 58 to the output of the operation amplifier 52. The replica bias loop 52 comprises a current mirror 58 connected via line 59 to the NMOS 57. The replica bias loop 51 generates a biasing voltage $V_{bias}$ and is connected via a line 60 and a switch 22a to the control input terminal 18 of the switched level-shift circuit 5. The control loop causes a voltage $V_{LS}$ to be $V_{REF}$.

The switched level-shift circuit (SLSC) according to the present invention may be used for sample circuits or for continues circuits. It can be used for sampling switches in sample data and switch capacitors (SC) circuits such as ADCs and switch capacitor filters. Furthermore a switched level-shift circuit 5 according to the present invention may be used in continuos applications allowing more power efficient implementation of continuously operated circuits such as PGAs, tuneable filters, bypass switches or signal path stearing.

1 switch transistor
2 gate
3 line
4 output terminal
5 switched level-shift circuit
7 source
8 line
9 node
10 drain
11 output line
12 signal input line
13 input terminal
14 line
15 analog level shift circuit
16 line
17 output signal line
18 control input terminal
19 control line
20 control line
21 control line
22a enable switch
22b discharge switch
23a enable switch
24 supply voltage terminal
25 node
26 inverter
27 line
28 line
29 disable switch
30 current source
31 resistor
32 MOS-FET
33 line
34 grounding line
35 gate
36 drain
37 source
38 current source
39 gate
40 MOS-FET
41 gate
42 line
43 grounding line
44 operation amplifier
45 input terminal
46 input terminal
47 output
48 line
49 node
50 line
51 replica bias loop
52 operation amplifier
53 input terminal
54 line
55 input terminal
56 reference voltage source
57 NMOS
58 feedback line
59 line
60 line

The invention claimed is:

1. Switched level-shift circuit for a signal-switch which is provided for switching an applied analog input signal, wherein the switched level-shift circuit comprises:
   a) an input terminal for the analog input signal applied to the signal-switch;
   b) a control input terminal for a control signal;
   c) an analog level-shift circuit which adds a constant voltage to the analog input signal to generate a level-shifted analog output signal when the control signal is in a first logical state, the analog level-shift circuit comprising:
      i) a first current source which is switched on when the control signal is in the first logical state;
      ii) at least one resistor connected in series with the current source wherein the resistor generates a constant voltage drop when the first current source is switched on; and
      iii) a MOS-FET connected in series to the resistor, wherein the MOS-FET has a gate connected to the signal input terminal, a source and a drain connected to the resistor, wherein the generated constant voltage drop of the resistor and the gate source voltage of the MOS-FET form the constant voltage added to the analog input signal to generate the level-shifted analog output signal; and
   d) an output terminal for the generated level-shifted analog output signal which is connected to a gate terminal of said signal-switch.

2. Switched level-shift circuit according to claim 1 wherein the source of the MOS-FET is connected to ground.

3. Switched level-shift circuit according to claim 1 wherein the source of the MOS-FET is connected to a second current source.

4. Switched level-shift circuit according to claim 3 wherein both current sources are formed by a MOS-FET each having a gate which is connected to an enable switch which switches a bias voltage to the gate of the MOS-FET when the control signal is in the first logical state.

5. Switched level-shift circuit according to claim 1 wherein the output terminal of the switched level-shift circuit is connected to a disable switch which switches the gate of the signal-switch to ground when the control signal is in a second logical state.

6. Switched level-shift circuit for a signal-switch which is provided for switching an applied analog input signal, wherein the switched level-shift circuit comprises:
   a) an input terminal for the analog input signal applied to the signal-switch;
   b) a control input terminal for a control signal;
   c) an analog level-shift circuit which adds a constant voltage to the analog input signal to generate a level-shifted analog output signal when the control signal is in a first logical state, the analog level-shift circuit comprising:

i) an operational amplifier the supply voltage of which is switched on to enable the operation amplifier when the control signal is in the first logical state, wherein the operational amplifier has a first non inverting input connected to the input terminal of the switched level-shift circuit;

ii) an output connected to a first switchable current source, a second inverting input, wherein the analog level-shift circuit further comprises a resistor connected in series with the first switchable current source, wherein the resistor generates a constant voltage drop when the first switchable current source is switched on by the enabled operational amplifier; and iii) a second switchable current source connected in series with the resistor which is switched on when the control signal is in the first logical state; and d) an output terminal for the generated level-shifted analog output signal which is connected to a gate terminal of said signal-switch.

7. Switched level-shift circuit according to claim 1 wherein the switched level-shift circuit is connected to a replica bias loop for calibrating the constant voltage.

8. Switched level-shift circuit according to claim 1 wherein the switched level-shift circuit operates the signal-switch with a constant gate overdrive when the control signal is in a first logical state.

9. Switched level-shift circuit according to claim 1 wherein the switched level-shift circuit is a differential switched level-shift circuit for a differential analog input signal.

10. Switched level-shift circuit according to claim 1 wherein the signal-switch is a MOS-FET.

* * * * *